(12) United States Patent
Maurino

(10) Patent No.: US 8,284,090 B2
(45) Date of Patent: Oct. 9, 2012

(54) METHOD AND APPARATUS FOR ANALOG TO DIGITAL CONVERSION OF SMALL SIGNALS IN THE PRESENCE OF A LARGE DC OFFSET

(75) Inventor: Roberto Maurino, Turin (IT)

(73) Assignee: Analog Devices, Inc., Norwood, MA (US)

( * ) Notice: Subject to any disclaimer, the term of this patent is extended or adjusted under 35 U.S.C. 154(b) by 283 days.

(21) Appl. No.: 12/728,391

(22) Filed: Mar. 22, 2010

(65) Prior Publication Data

US 2011/0227772 A1   Sep. 22, 2011

(51) Int. Cl.
 *H03M 1/12* (2006.01)
(52) U.S. Cl. ........ 341/156; 375/335; 375/143; 375/343; 330/279; 345/102; 345/76; 345/690; 345/82; 345/692; 342/189; 360/78.04; 360/75; 360/77.02
(58) Field of Classification Search .......... 341/126–155; 375/375, 376; 330/279; 702/142; 342/189; 345/102, 690; 360/78.04; 327/105, 159, 327/156; 706/37; 708/213
See application file for complete search history.

(56) References Cited

U.S. PATENT DOCUMENTS

| | | | | |
|---|---|---|---|---|
| 5,422,601 A * | 6/1995 | Kovacs et al. | ................. | 330/279 |
| 5,495,512 A * | 2/1996 | Kovacs et al. | ................. | 375/376 |
| 5,543,795 A * | 8/1996 | Fernald | .......................... | 341/163 |
| 6,546,557 B1 * | 4/2003 | Ovadia | .......................... | 725/129 |
| 6,903,672 B1 * | 6/2005 | Maurino | ....................... | 341/143 |
| 7,060,201 B2 * | 6/2006 | Farrar | ...................... | 252/301.23 |
| 7,205,921 B1 * | 4/2007 | Savla | ............................ | 341/155 |
| 7,479,913 B1 | 1/2009 | Thiagarajan et al. | | |
| 7,680,236 B1 * | 3/2010 | Melanson et al. | ............ | 375/376 |
| 8,049,708 B2 * | 11/2011 | Santo et al. | .................... | 345/102 |
| 2005/0248478 A1 | 11/2005 | Ling | | |
| 2007/0293180 A1 | 12/2007 | Rahman et al. | | |
| 2009/0085789 A1 | 4/2009 | Schuur et al. | | |
| 2009/0261998 A1 | 10/2009 | Chae et al. | | |

OTHER PUBLICATIONS

Janos Markus, et al., "Theory and Applications of Incremental ΔΣ Converters", IEEE Transactions on Circuits and Systems, I: Regular Papers, vol. 51, No. 4, pp. 678-690, Apr. 2004.
Firat Yazicioglu, et al., "A 60 uW 60 nV/ rtHz Readout Front-End for Portable Biopotential Acquisition Systems", IEEE Journal of Solid State Circuits, vol. 42, No. 5, pp. 1100-1110, May 2007.
Tim Denison, et al., "A 2 uW 100 nV/rtHz Chopper Stabilized Instrumentation Amplifier for Chronic Measurement of Neural Field Potentials", IEEE Journal of Solid State Circuits, vol. 42, No. 12, pp. 2934-2945, Dec. 2007.
PCT International Search Report and Written Opinion from PCT/US11/26946 mailed on Apr. 29, 2011.

* cited by examiner

*Primary Examiner* — Lam T Mai
(74) *Attorney, Agent, or Firm* — Kenyon & Kenyon LLP

(57) ABSTRACT

Embodiments of the present invention provide a hybrid analog to digital converter that may include a DAC coupled to a hybrid analog to digital converter input; an integrator having an input coupled to the hybrid analog to digital converter input and the DAC, and generating an integrator output; a comparator coupled to the integrator output and having a comparator output; a successive approximation register coupled to the comparator output; and a counter coupled to the comparator output to generate an hybrid analog to digital converter output. The hybrid analog to digital converter may be operable as a successive approximation register converter and a continuous time sigma delta converter.

20 Claims, 8 Drawing Sheets

100

120

300

400

600

800

METHOD AND APPARATUS FOR ANALOG TO DIGITAL CONVERSION OF SMALL SIGNALS IN THE PRESENCE OF A LARGE DC OFFSET

BACKGROUND

The present invention relates to analog to digital conversion of small signals in the presence of a large DC offset. AD converters are used in integrated circuits for a wide variety of applications. Often, the signal to be converted contains a small AC signal that sits atop of a DC offset. The DC offset interferes in the conversion. Consequently, AD converters attempt to remove the DC offset before performing the analog to digital conversion.

Prior solutions to remove DC offsets include AC coupling. For AC coupling, a buffer or amplifier with a high pass transfer function is provided before the converter itself. The AC coupling is designed to strip off the DC component of an input signal but allows the AC component to pass to the ADC. The high pass AC coupling is usually provided in the form a large capacitor. However, large capacitors are difficult to manufacture as an integrated circuit because they take up an overwhelming amount of silicon area. Sometimes, capacitors cannot be provided within the integrated circuit and must be provided as an external capacitor, which increases complexity and cost of the analog-to-digital conversion systems.

Accordingly, there is a need in the art for analog to digital conversion of small signals that accurately removes a DC offset while at the same time minimizing cost and components.

DETAILED DESCRIPTION

Embodiments of the present invention provide a hybrid analog to digital converter that may include a DAC having a terminal for a signal to be converted; an integrator having an input coupled to the hybrid analog to digital converter input and the DAC terminal, and generating an integrator output; a comparator coupled to the integrator output and having a comparator output; a successive approximation register coupled to the comparator output; a counter coupled to the comparator output to generate an hybrid analog to digital converter output; and a single bit DAC coupled to the integrator input, wherein the single bit DAC is controlled by the comparator during a sigma delta converter operation.

Embodiments of the present invention provide a method of converting an analog signal into a digital signal while removing a DC offset. The method may include, in a coarse calibration phase, performing successive approximation register bit trials to calculate a coarse calibration value of the DC offset. The method may also include, in a fine calibration phase, performing incremental continuous time sigma delta conversion to calculate a fine calibration value of the DC offset using the coarse calibration value of the DC offset. The method may further include, in a normal operation phase, converting an input analog signal into a digital signal and removing the DC offset using both the coarse calibration value and fine calibration value of the DC offset.

Embodiments of the present invention provide an apparatus that may include a sensor to receive an information signal and to convert the information signal to an AC signal. The apparatus may also include a hybrid converter to receive the AC signal, convert the AC signal into a digital signal, and remove a DC offset. The hybrid converter may include a DAC, an integrator having an input coupled the DAC, a comparator coupled to the integrator, a successive approximation register coupled to the comparator, and a counter coupled to the comparator. The hybrid converter may be operable as a successive approximation register converter and a continuous time sigma delta converter.

Figure 1:
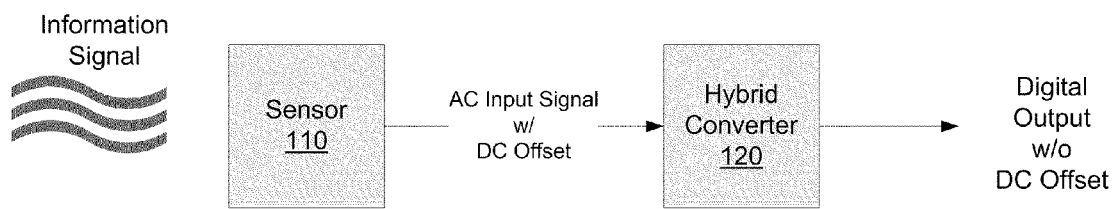
FIG. 1 is a simplified diagram of a sensor system according to an embodiment of the present invention.

FIG. 1 is a simplified block diagram of a sensor system 100 according to an embodiment of the present invention. The sensor system 100 may include a sensor 110 and a hybrid converter 120. The sensor 110 may receive an information signal at its input and may convert the information signal into an AC input signal. The sensor may be a gas sensor, for example, a Carbon Dioxide ($CO_2$) sensor. In a gas sensor example, the sensor system 100 may also include an infrared (IR) signal source (not shown). The sensor system 100 may set the IR signal source at different power levels and measure the voltage detected at the two power levels to determine the gas concentration. The power levels of the IR signals are inversely proportional to the concentration of gas molecules because gas molecules interfere with the IR signals. In other words, higher gas concentration correspond to lower IR signal power levels.

Figure 2:
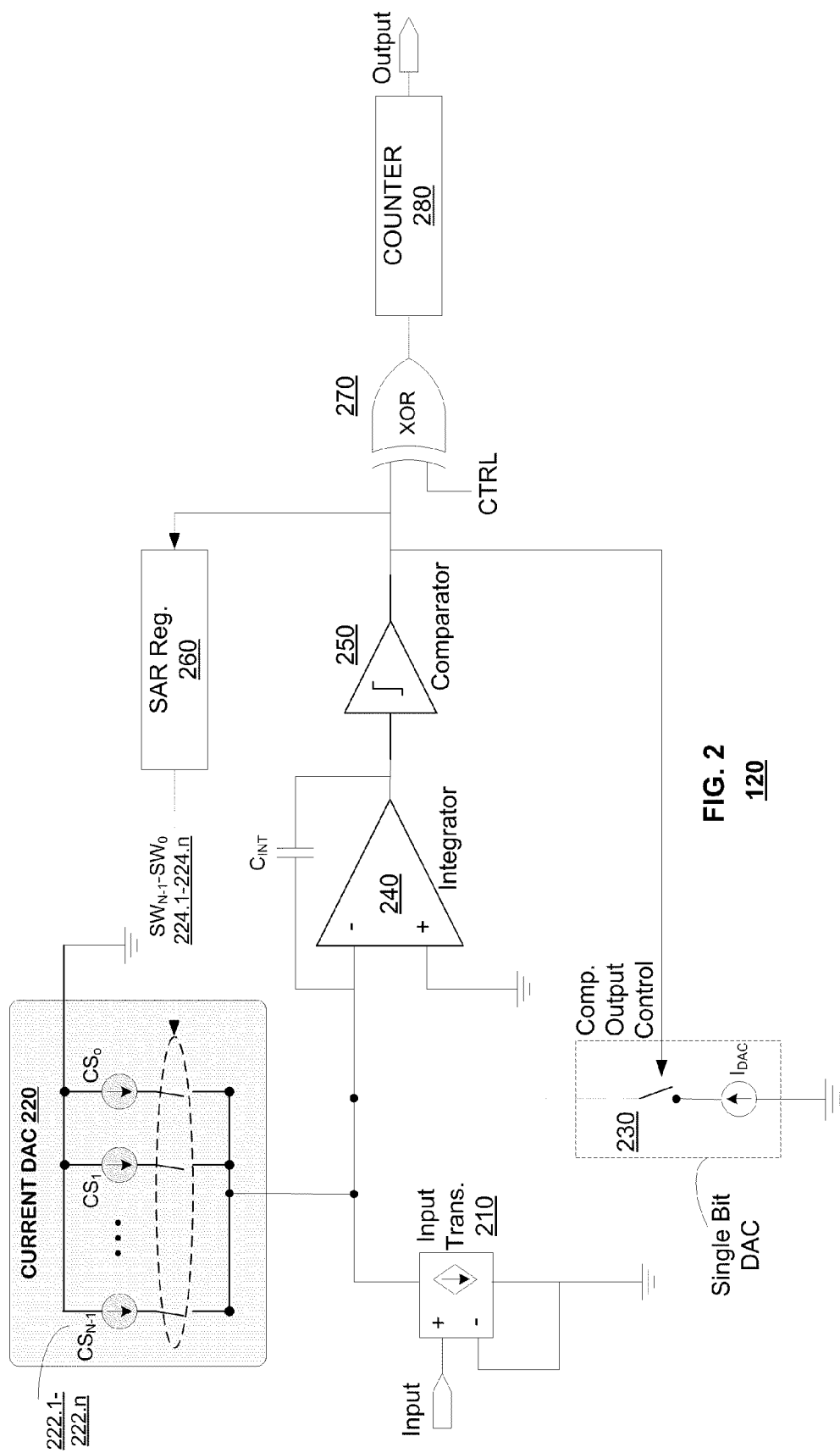
FIG. 2 is a simplified diagram of a hybrid converter according to an embodiment of the present invention.

The AC input signal may be inputted into the hybrid converter 120 to convert the AC input signal into a digital signal; however, the AC input signal may have a DC offset included therein that may interfere with the conversion. FIG. 2 is a simplified block diagram of the hybrid converter 120 according to an embodiment of the present invention. Hybrid converter 120 may remove the DC offset included in the AC input signal and may convert the AC input signal into a digital signal. The hybrid converter 120 may have an ADC architecture provided as either a successive approximation register (SAR) converter or a continuous time (CT) sigma delta converter.

Hybrid converter 120 may include an input transconductor 210, a programmable current DAC 220, a switch 230, a current source $I_{DAC}$, an integrator 240 with a coupled integrating capacitor $C_{INT}$, a comparator 250, a SAR register 260, an XOR gate 270, and a counter 280. The input transconductor 210 may convert an input voltage ($V_{in}$) into an input current ($I_{in}$). The input transconductor 210 may have a transconductance value of $g_m$, which is the ratio of the output current and input voltage. Therefore, the input current may be defined as $I_{in}=g_m*V_{in}$.

The current DAC 220 may perform bit trials for successive approximation. Current DAC 220 may include a plurality of binary weighted current sources 222.1-222.n that correspond to the N bit positions of the converter, where current source $CS_{N-1}$ may correspond to the most significant bit (MSB) and $CS_0$ may correspond to the least significant bit (LSB). The current DAC 220 may also include a plurality of switches 224.1-224.n, where each switch may be coupled to a corresponding binary weighted current source.

The input transconductor 210 and the current DAC 220 may be coupled to an inverting terminal of an integrator 240. The non-inverting terminal of the integrator 240 may be coupled to ground. Also, an integrating capacitor $C_{INT}$ may be coupled to the inverting terminal and output of the integrator 240. The input transconductor 210, current DAC 220, and integrator 240 may be coupled to a switch 230. The switch 230 may connect or disconnect a feedback path to another current source $I_{DAC}$. The current DAC 220 and $I_{DAC}$ may generate currents that have an orientation opposite the current flow of the transconductor 210.

Comparator 250 may be coupled to the integrator's 240 output. Comparator's 250 output may be coupled to a single bit DAC. The single bit DAC may include a control switch 230 and a current source $I_{DAC}$. The comparator's 250 output may control switch 230 operation in providing the feedback path to current source $I_{DAC}$. When switch 230 is in a closed state the current source $I_{DAC}$ may be coupled to the inverting terminal of the integrator 240. When switch 230 is in an open state, an open circuit results and no feedback path is provided to the integrator 240.

The comparator 250 output may also be coupled to the SAR register 260 that may store calculated bit positions from bit trials and may set the values for the switches 224.1-224.n in the current DAC 220 accordingly. An XOR gate 270 may further be coupled to the comparator 250. A counter 280 may be coupled to the XOR gate 270 output. The counter 280 may act like a decimation filter or suitable digital filters.

Moreover, the hybrid converter 120 may be implemented on the same die as the sensor 110.

The hybrid converter 120 may be operable as both a SAR converter and CT sigma delta converter. The hybrid converter 120 may operate in three phases, where two phases may be calibration phases and one phase may be a normal operation phase. In a first calibration phase, a coarse calibration phase, the hybrid converter 120 may operate as a SAR converter and may perform a coarse DC offset removal through SAR conversion. In a second calibration phase, a fine calibration phase, the hybrid converter 120 may measure the residual DC offset not captured in the coarse calibration phase by rearranging the converter as a CT sigma delta converter. After the calibration phases, the hybrid converter may operate in the normal operation phase where it may convert an AC input signal into a digital signal while removing any DC offset according to the measured DC offset values in the two calibration phases.

Figure 3:
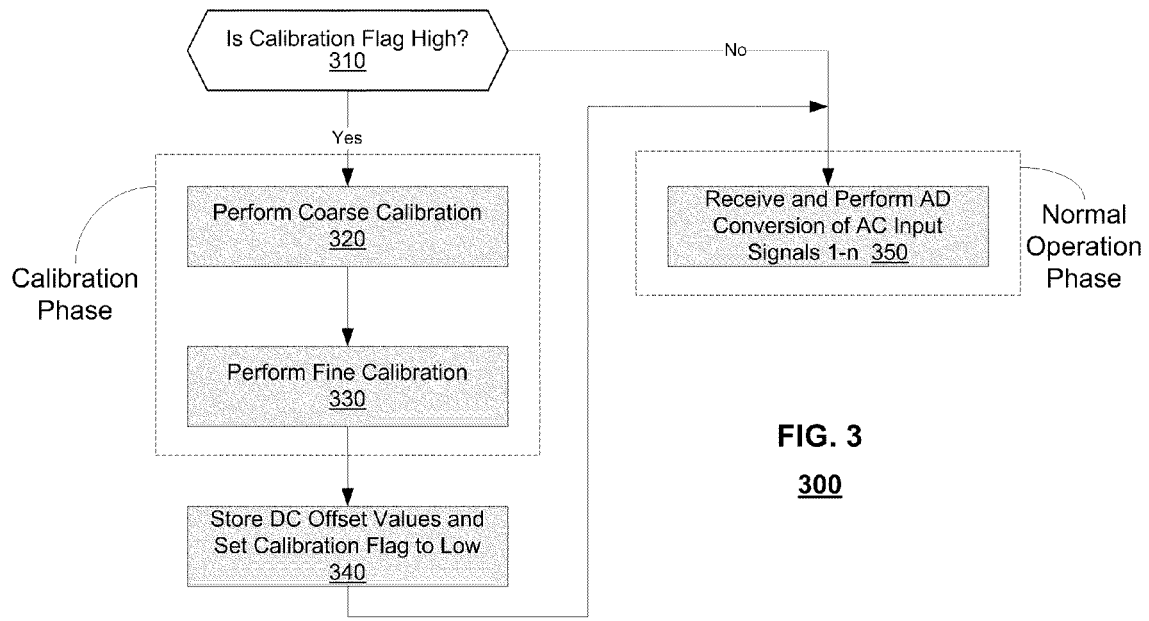
FIG. 3 shows a simplified process flow according to an embodiment of the present invention.

The transitions between the three phases may be provided in a variety of schemes. FIG. 3 is a simplified flow diagram of a method 300 of the hybrid converter operation according to an embodiment of the present invention. Method 300 may begin with checking if a calibration flag is set to a high position (block 310). The calibration flag may be set to a high position according to a predetermined condition. For example, the calibration flag may be set to high when the electronic device that the hybrid converter is provided in is turned on. If the calibration flag is set to low, the method 300 may skip the calibration phase and go directly to normal operation phase. If the calibration flag is set to high, the method 300 may enter into the calibration phase. Method 300 may first perform coarse calibration of the DC offset (block 320). Method 300 may then perform fine calibration of the DC offset (block 330). After calculating the coarse calibration value and fine calibration value of the DC offset, the DC offset values may be stored, and the calibration flag may be set the low position (340).

Method 300 may then perform analog-to-digital conversion of all received input signals successively while removing the DC offset according to the stored calibrated DC offset values until the calibration flag is triggered to a high position by the occurrence of the predetermined condition (block 350). According to this embodiment, the calibration phases may only need to be performed once for all AC input signals received. The calibrated DC offset values may be stored and used multiple times in the normal operation phase for the conversion of multiple AC input signals.

Figure 4:
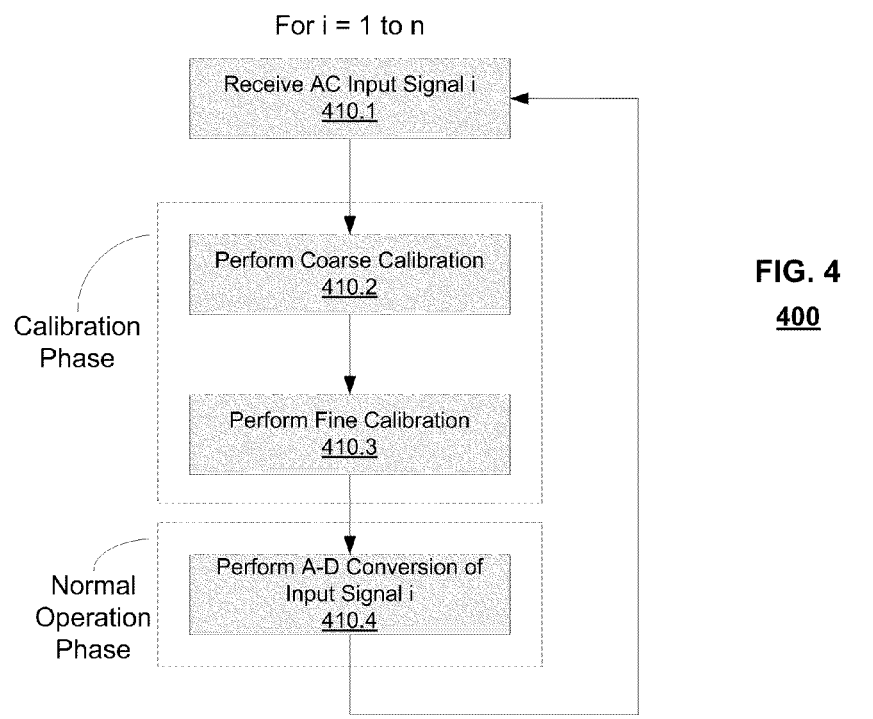
FIG. 4 shows a simplified process flow according to an embodiment of the present invention.

Alternatively, DC offset calibration values may be calculated individually for each AC input signal. FIG. 4 is a simplified flow diagram of a method 400 of the hybrid converter operation according to an embodiment of the present invention. Method 400 may begin with receiving a first AC input signal (block 410.1). The reception of AC input signal 1 may trigger the hybrid converter to enter the calibration phase. Method 400 may first perform coarse calibration of the DC offset (block 410.2). Method 400 may then perform fine calibration of the DC offset (block 410.3). After calculating the coarse calibration value and fine calibration value of the DC offset, method 400 may enter into the normal operation phase. In the normal operation phase, method 400 may perform analog-to-digital conversion of AC input signal 1 while removing the DC offset according to the calibrated DC offset values calculated in the previous steps.

The method 400 may repeat this process for each AC input signal received. Therefore, individual calibration may be performed for each AC input signal. This embodiment may be used in conjunction with image sensor devices such as pixels where each image sensor device may have a unique base charge value (DC offset). For that reason, each input signal may be calibrated before conversion in order to remove the unique base charge (DC offset).

Moreover, both calibration phases may not be performed for each input signal in an alternative embodiment. For example, coarse calibration may perform only when the hybrid converter is first turned on, and fine calibration may be performed for each individual AC input signal.

Figure 5:
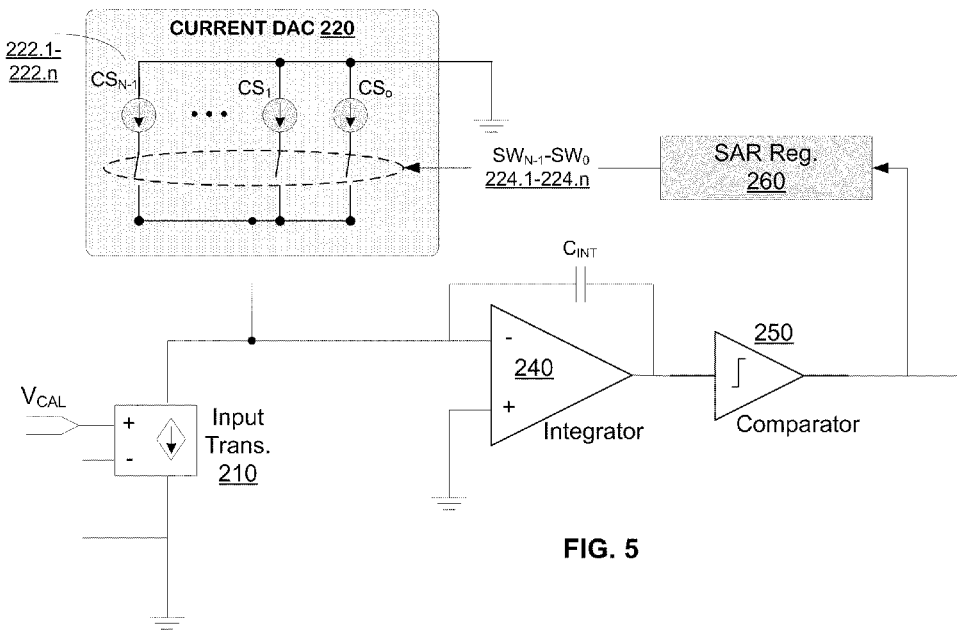
FIG. 5 is a simplified diagram of a hybrid converter in coarse calibration phase according to an embodiment of the present invention.

Each of the three phases will now be described in further detail. FIG. 5 is a simplified block diagram of the hybrid converter when it is operating in the coarse calibration phase. The switch 230 of FIG. 2 may be in an open state thereby disconnecting the current source $I_{DAC}$ and forming an open circuit. The relevant components of the hybrid converter in coarse calibration phase may be the input transconductor 210, the current DAC 220, the integrator 240 with coupled integrating capacitor $C_{INT}$, the comparator 250, and the SAR register 260.

Figure 6:
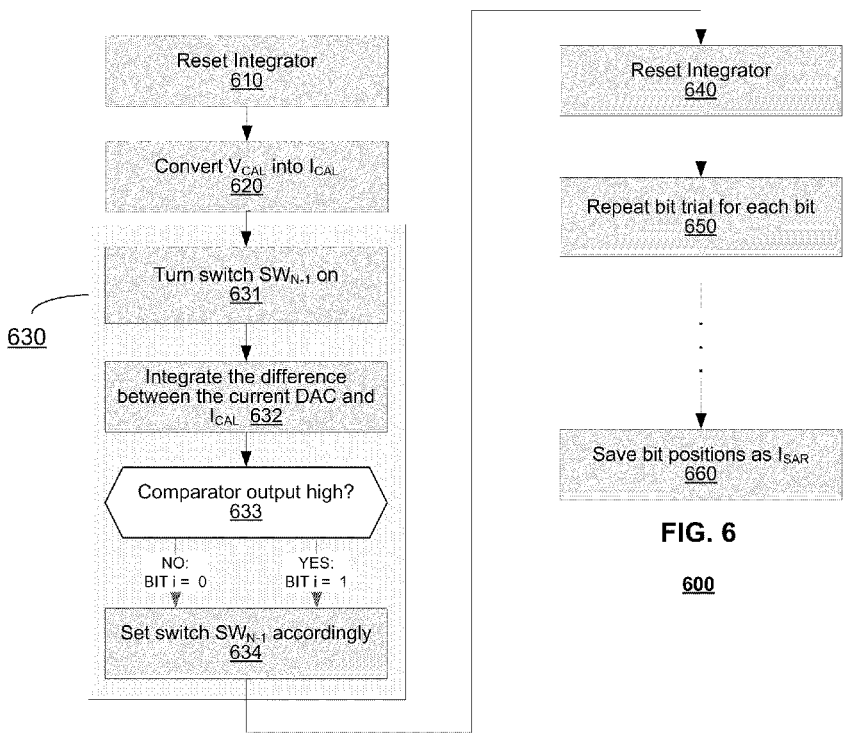
FIG. 6 shows a simplified process flow according to an embodiment of the present invention.

The hybrid converter, in coarse calibration phase, may perform SAR bit trials on the input. An input voltage $V_{CAL}$ may be applied to the converter input, where $V_{CAL}$ may be a DC voltage that represents the DC offset. FIG. 6 is a simplified flow diagram of a method 600 of the bit trial operation in the coarse calibration phase according to an embodiment of the present invention. Method 600 may begin by resetting the integrator 240 by shorting the voltage across the integrating capacitor $C_{INT}$ (block 610). The input voltage $V_{CAL}$ may then be converted to an input current $I_{CAL}$, which is coupled to the inverting input of the integrator 240 (block 620).

Next, a bit trial test for the MSB may be performed (block 630). Bit trials convert the input current to a digital codeword representing the magnitude according to bitwise test, which is an iterative trial and error process. Switch $SW_{N-1}$ 224.1 may be turned on connecting the MSB current source $CS_{N-1}$ 222.1 of the current DAC 220 to the inverting input of the integrator 240 (block 631). Both switch $SW_{N-1}$ and current source $CS_{N-1}$ correspond to the MSB of the digital signal. The integrator 240 may integrate the difference between the output of the current DAC and the input current $I_{CAL}$ (block 632). The comparator 250 may compare the integrator output to determine the polarity of the integrator output. If the integrator output is positive, the comparator 250 may set its output to high. Similarly, if the integrator output is negative, the comparator 250 may set its output to low. If the comparison yields a high output, the MSB bit is 1. Conversely, if the comparison yields a low output, the MSB bit is 0 (block 633). SAR register 260 may store the MSB bit value and may set switch $S_{N-1}$ accordingly for future bit trials of the other bit positions (block 634).

Integrator 240 may then be reset by shorting the voltage across the integrating capacitor $C_{INT}$ (block 640). The iterative process may continue until all bit positions are calculated (block 650). The integrator may be reset after each bit trial. All calculated bit positions may be saved as $I_{SAR}$ thus concluding the coarse calibration phase (block 660).

$V_{SAR}$ is the voltage representation of $I_{SAR}$ according to the relationship $V_{SAR}=I_{SAR}/g_m$, where gm is the transconductance value of the input transconductor 210. $V_{SAR}$ represents the DC offset of the input signal; however, $V_{SAR}$ is a rough estimation. A residual DC offset is likely to remain. For small input signals, a more precise calculation of DC offset is desirable because the DC offset may be much larger than the small input signal. Moreover, coarse calibration is a relatively quick process and, therefore, may be performed at various times.

Figure 7:
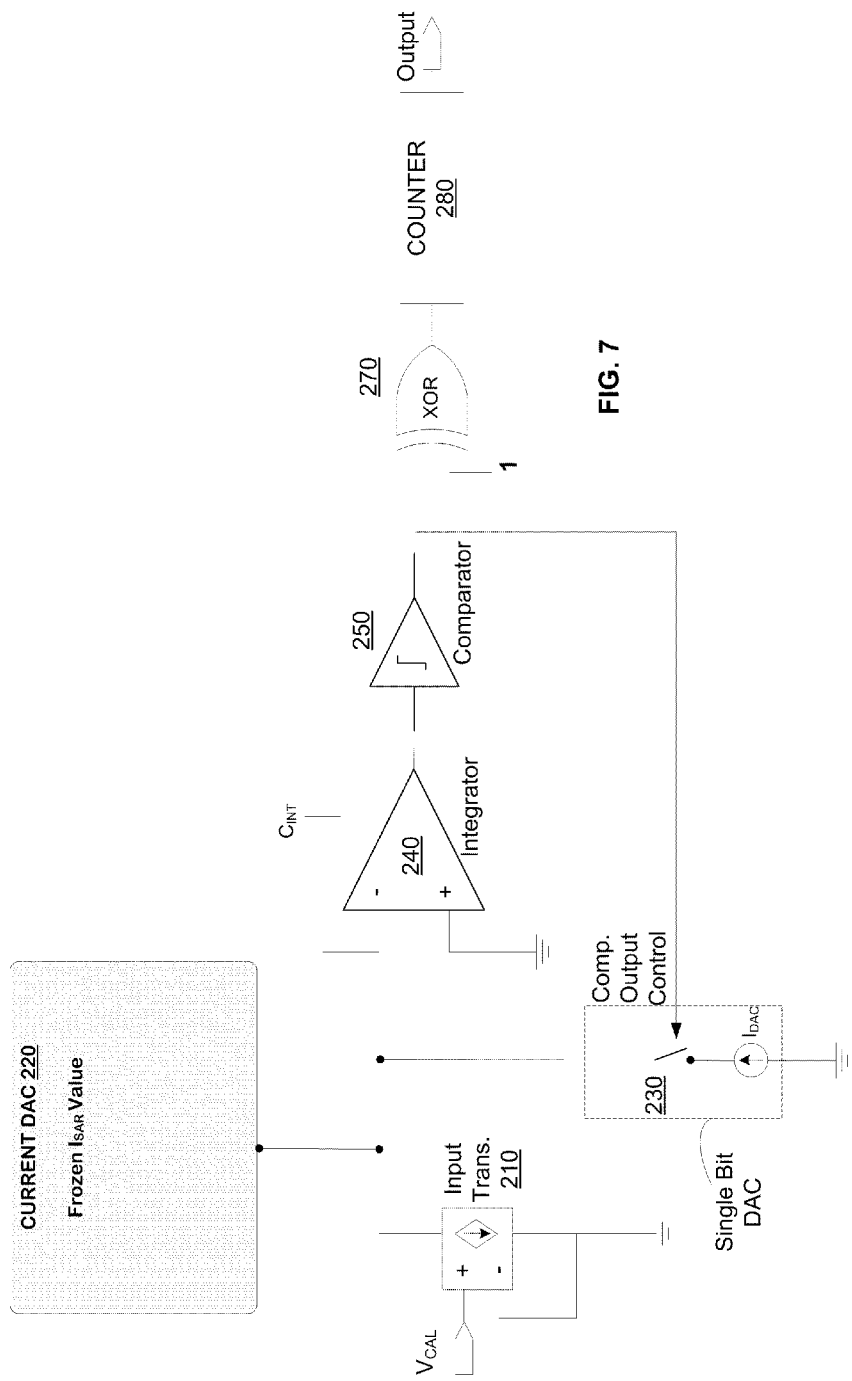
FIG. 7 is a simplified diagram of a hybrid converter in fine calibration phase according to an embodiment of the present invention.

After the coarse calibration phase, the converter may enter the fine calibration phase. The hybrid converter may operate as an incremental CT sigma delta converter in this phase. FIG. 7 is a simplified block diagram of the hybrid converter when it is operating in the fine calibration phase. Operation of the current DAC 220 and SAR register (not shown) may be "frozen" to the $I_{SAR}$ value calculated in a previous coarse calibration phase. The relevant components of the hybrid converter in fine calibration phase may be the input transconductor 210, the frozen current DAC 220, the switch 230, the current source $I_{DAC}$, the integrator 240 with coupled integrating capacitor $C_{INT}$, the comparator 250, the XOR gate 270, and the counter 280.

Switch 230 may be controlled by the output of the comparator 250 in this phase. If the comparator output is high, switch 230 connects $I_{DAC}$ to the integrator 240. Conversely, if the output of the comparator is low, switch 230 disconnects $I_{DAC}$ from the integrator 240 forming an open circuit. $I_{DAC}$ plus switch 230 constitute the one bit feedback DAC of the sigma delta converter with two possible output values of 0 and $I_{DAC}$. Moreover, the XOR gate 270 may be set to 1 in order to invert the comparator 250 output.

Figure 8:
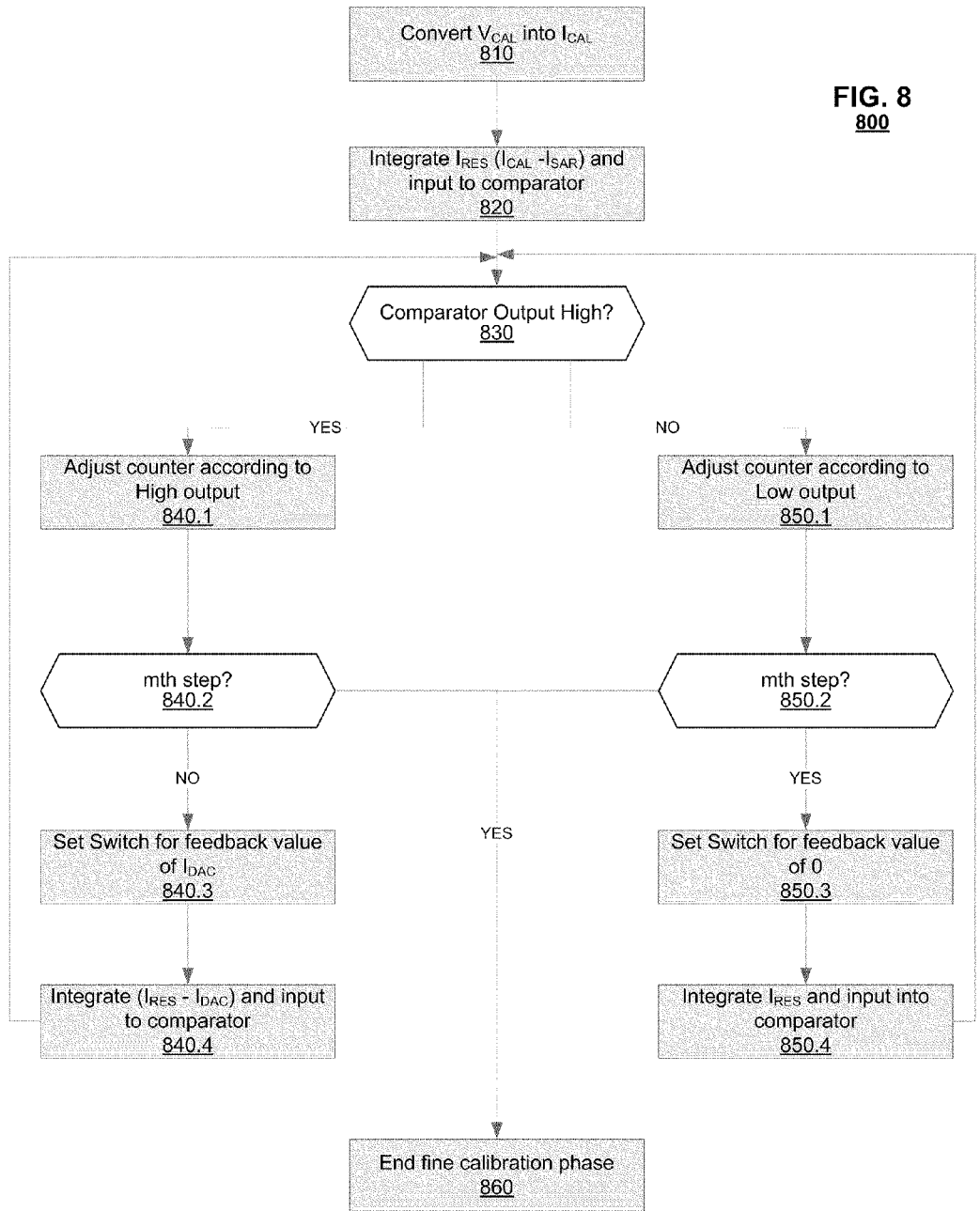
FIG. 8 shows a simplified process flow according to an embodiment of the present invention.

FIG. 8 is a simplified flow diagram of a method 800 of the incremental CT sigma delta conversion in the fine calibration phase according to an embodiment of the present invention. Method 800 may begin by converting the input voltage $V_{CAL}$ into an input current $I_{CAL}$ (block 810). The input voltage $V_{CAL}$ may be the same DC voltage that was applied to the hybrid converter in a previous coarse calibration phase. In the first step of the conversion, only the $I_{RES}$ may be integrated and fed into the comparator (block 820). $I_{RES}$ is the difference between $I_{CAL}$ and $I_{SAR}$, ($I_{CAL}-I_{SAR}$), and is the current representation of the residual DC offset which has not been cancelled by $I_{SAR}$ in the coarse calibration phase. $I_{RES}$ may also be expressed as:

$$I_{RES}=g_m*(V_{CAL}-V_{SAR}).$$

The comparator may compare the integrated value of the current $I_{RES}$, setting the comparator output high if the integrated current value is positive and setting the comparator output low if the integrated current value is negative (block 830). If the comparison yields a high output, the counter 280 may be adjusted accordingly (block 840.1). The counter 280 may act like a decimation filter or other suitable digital filters. If the previous step was the final $m_{th}$ step, the fine calibration phase may conclude with the fine calibration DC offset value being stored in the counter 280 (block 860). However, if it is not final mth step, method 800 may set switch 230 to connect $I_{DAC}$ to the integrator 240 thereby providing a feedback value of $I_{DAC}$ (block 840.3). Switch 230 may be controlled by the comparator output where a high comparator output closes switch 230 connecting $I_{DAC}$ to the integrator 240. Consequently, the integrator input value may now be ($I_{RES}-I_{DAC}$). The integrator may integrate the integrator input value of ($I_{RES}-I_{DAC}$) to generate an integrated output that may be inputted into the comparator (block 840.4). The comparator may then compare the integrated value and repeat the iterative process until the $m_{th}$ step is reached.

If the comparison yields a low output in block 830, the counter 280 may be adjusted accordingly (block 850.1). The low comparator output may set switch 230 to an open position so that the feedback value is 0 for the next iteration (block 850.3). Consequently, the integrator input value may now be $I_{RES}$. The integrator may integrate the integrator input value of $I_{RES}$ to generate an integrated output that may be inputted into the comparator (block 850.4). The comparator may then compare the integrated value and repeat the iterative process until the $m_{th}$ step is reached.

The integrator output may be represented by the following equation:

$$f(m) = \frac{T_s}{C_{INT}}\left(mI_{RES} - \sum_{i=1}^{m-1} v(i)I_{DAC}\right),$$

where f(m) is the integrator output, m is the time step, the quantity (m $I_{RES}$) represents the integrated input residual current, the quantity $$\sum_{i=1}^{m-1} v(i)I_{DAC}$$

represents the feedback, and Ts is the clock period. v(i) is either 0 or 1, depending on the comparator decision during step i.

Since the residual current $I_{RES}$, is unknown, solving for $I_{RES}$ results in:

$$I_{RES} = I_{DAC}\frac{1}{m}\sum_{i=1}^{m-1} v(i) + \frac{C_{INT}}{T_s}\frac{f(m)}{m}$$

If $I_{RES}$ is smaller than $I_{DAC}$, it can be shown that $C_{INT}/Ts*f(m)$ is less than $2*I_{DAC}$. Therefore, the longer the period of time, m, the more accurate the incremental CT sigma delta converter may operate.

In another embodiment of the present invention, the incremental CT sigma delta converter may perform one extra step m with only the feedback active and the input $V_{CAL}$ shorted. Alternatively, $I_{RES}$ may be set to 0 to achieve the same result. In this embodiment, the residual current may be expressed by the following equation:

$$I_{RES} = I_{DAC} \frac{1}{m} \sum_{i=1}^{m} v(i) + \frac{C_{INT}}{Ts} \frac{f(m+1)}{m}$$

In this embodiment, it can be shown that $C_{INT}/TS*f(m+1)$ is less than $I_{DAC}$, thus the error is halved as compared to the previous embodiment without the extra m+1 step. Therefore, the addition of one extra bit in the incremental CT sigma delta conversion may lead to more accurate result.

The XOR gate 270 may be set to 1 so the comparator output is negated before being input into the counter 280 in order to be easily subtracted in the subsequent normal operation phase. The counter 280, in the fine calibration phase, may be incremented in one direction (for example, down) and is incremented in the opposite direction (for example, up) in the subsequent normal operation phase. The output in fine calibration phase represents a DC offset value that is more precise than the LSB of the coarse calibration DC offset value; therefore, the output in fine calibration phase may be represented by the equation:

Output_Fine=$-(V_{CAL}-V_{SAR})$

Figure 9:
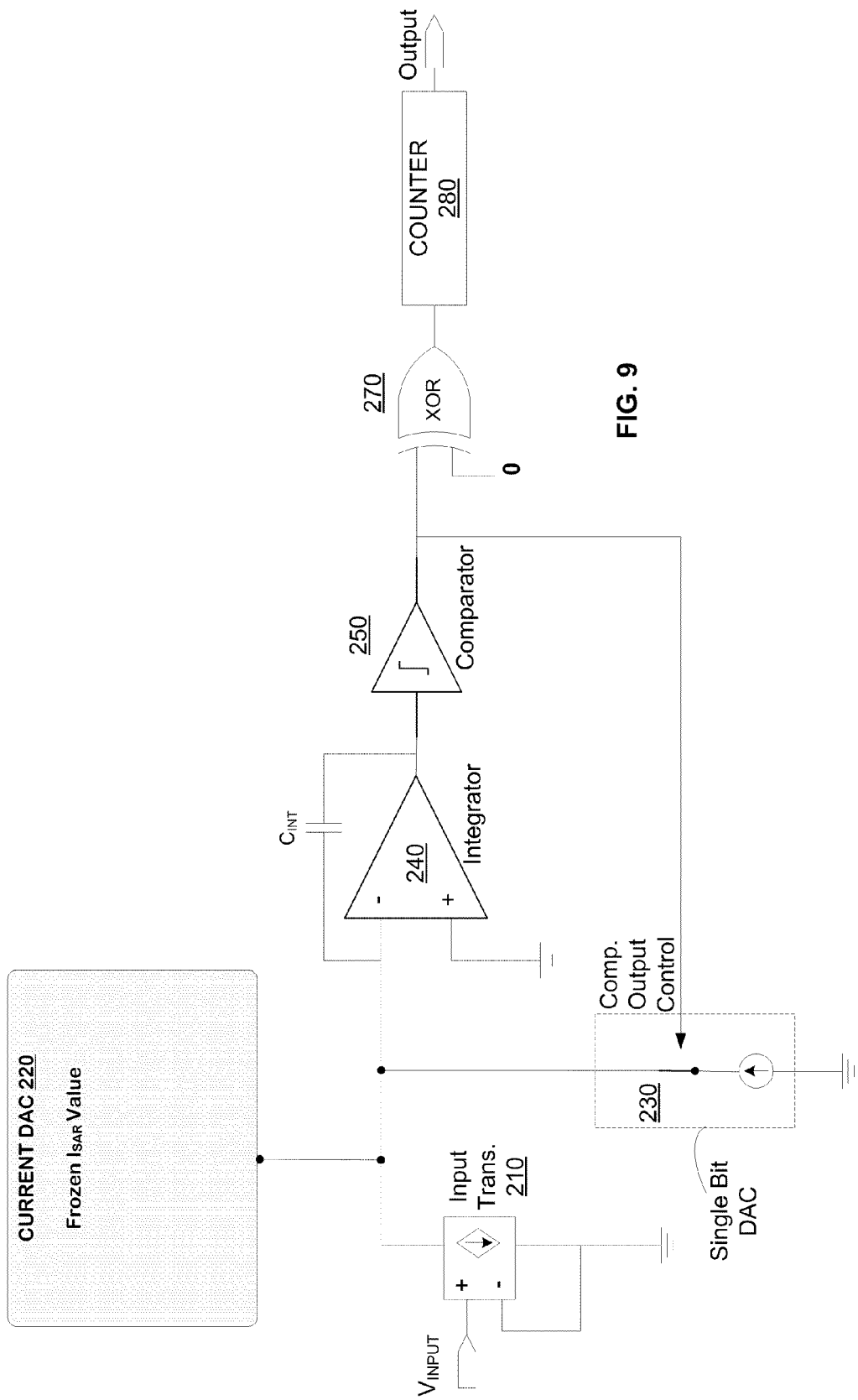
FIG. 9 is a simplified diagram of a hybrid converter in normal operation phase according to an embodiment of the present invention.

After the fine calibration phase, the hybrid converter may enter the normal operation phase. The hybrid converter may operate as an incremental CT sigma delta converter in this phase. FIG. 9 is a simplified block diagram of the hybrid converter when it is operating in the normal operation phase. The relevant portions of the hybrid converter in normal operation phase may be the input transconductor 210, the frozen current DAC 220, the switch 230, the current source $I_{DAC}$/the integrator 240 with coupled integrating capacitor $C_{INT}$, the comparator 250, the XOR gate 270, and the counter 280.

As shown in FIG. 9, the hybrid converter configuration in normal operation phase is substantially the same as the configuration in fine calibration phase except the XOR gate 270 may now be set to 0. Also, the input to the hybrid converter may be switched to $V_{INPUT}$, which is the AC input signal that is to be converted.

The hybrid converter may essentially operate in the same manner in normal operation phase as it did in fine calibration phase except the hybrid converter now may adjust the counter in the opposite direction (for example, up) as in the fine calibration phase because the XOR gate setting is reversed. The hybrid converter output in normal operation phase may be represented by the equation:

Output_Normal=$(V_{INPUT}-V_{SAR})-(V_{CAL}-V_{SAR})$

The equation may be simplified so that the hybrid converter output may be represented by:

Output_Normal=$V_{INPUT}-V_{CAL}$

Since $V_{CAL}$ represents the DC offset, the output in normal operation phase is the input signal minus DC offset. Therefore, the hybrid converter according to the present invention may accurately convert small analog signals into digital signals while removing the DC offset simultaneously. Also, the two calibration phases, fine and coarse, calculate the DC offset more accurately than prior systems. Moreover, the hybrid converter according to the present invention reuses the same hardware while operating in different phases thus conserving space and minimizing components.

Figure 10:
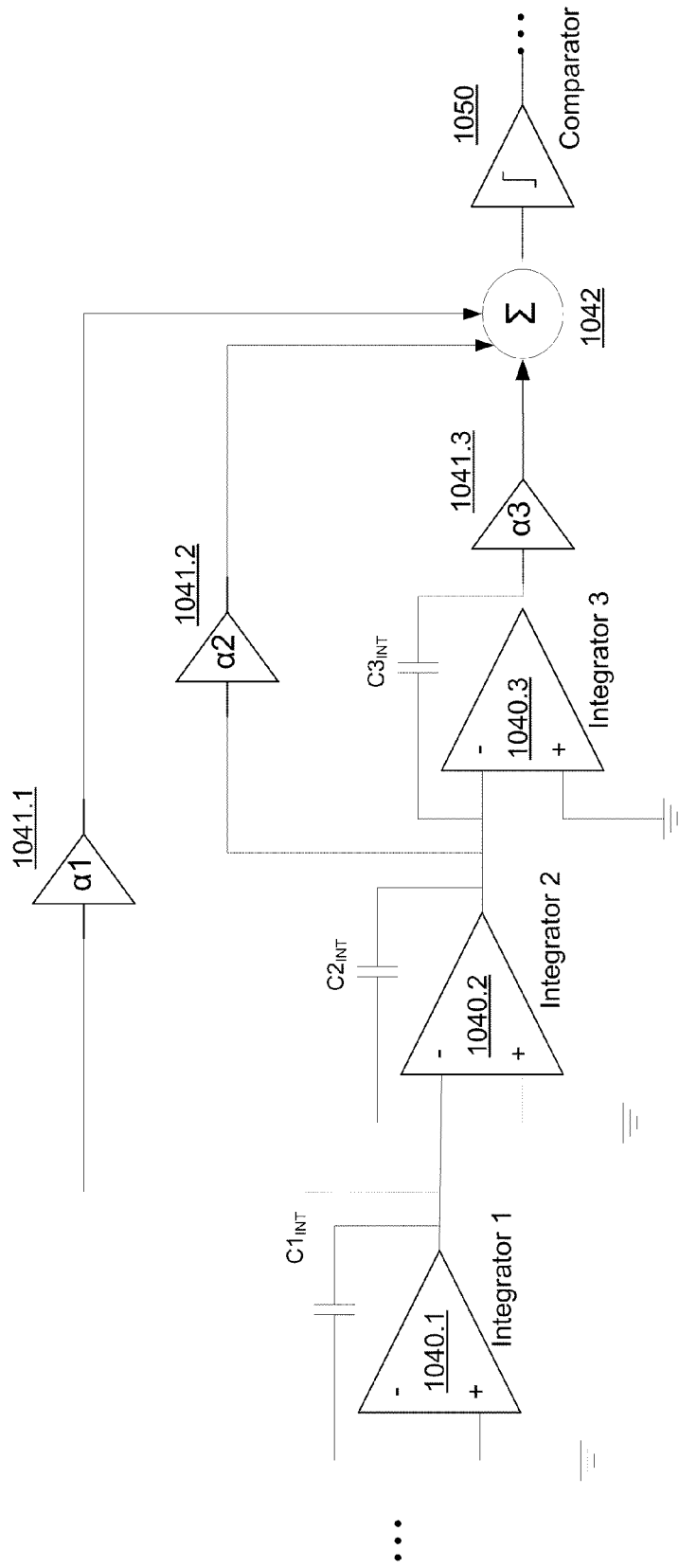
FIG. 10 is a simplified diagram of a higher order hybrid converter according to an embodiment of the present invention.

According to another embodiment of the present invention, the hybrid converter may be a higher order converter. Hybrid converter 120 of FIG. 2 may be transformed into a higher order converter by adding a cascaded series of integrators. FIG. 10 illustrates 3 integrators cascaded in series. The cascaded series of integrators may be substituted for the single integrator 240 in the hybrid converter 200 of FIG. 2. The hybrid converter input may be coupled to the first integrator 1040.1 that has a coupled capacitor $C_{INT}$. The output of integrator 1040.1 may be coupled to weighting device 1041.1 and a second integrator 1040.2, which has a coupled capacitor $C2_{INT}$. The output of integrator 1040.2 may be coupled to weighting device 1041.2 and a third integrator 1040.3, which has a coupled capacitor $C3_{INT}$. The output of integrator 1040.3 may be coupled to weighting device 1041.3. Each weighting device may have a different value according to its coupled integrator. The outputs of all three weighting devices 1041.1-1041.3 may be coupled to a summing junction 1042. The summing junction 1042 may add the weighting device outputs and may generate a summed output that may be inputted into the comparator 1050.

The counter in a higher order converter may be changed to correspond to the number of integrators. For example, three counters connected in series may be needed in a third order converter of FIG. 10. The counters may be decimation filters or other suitable digital filters. FIG. 10 shows a third order integrator series for illustration purposes only, and the present invention may compare any order converter.

According to another embodiment of the present invention, the hybrid converter may include multi-bit quantization. Hybrid converter 120 of FIG. 2 may include a multi-bit quantizer in place of the single comparator (a single bit quantizer). For example, a flash converter, which includes a plurality of comparators with different threshold voltages, may be included in the hybrid converter. Multi-bit quantization may improve the performance of the hybrid converter. For example, the coarse calibration phase may be performed at a faster speed because several SAR bit trials can be performed at once with multi-bit quantization. Moreover, multi-bit quantization may increase the resolution of the sigma delta conversion in the fine calibration and normal operation phases.

Several embodiments of the present invention are specifically illustrated and described herein. However, it will be appreciated that modifications and variations of the present invention are covered by the above teachings and within the purview of the appended claims without departing from the spirit and intended scope of the invention. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be implemented, for example, using a computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

I claim:

1. A hybrid analog to digital converter, comprising:
   a DAC having a terminal for a signal to be converted;
   an integrator having an input coupled to a hybrid analog to digital converter input and the DAC terminal, and generating an integrator output;
   a comparator coupled to the integrator output and having a comparator output;
   a successive approximation register coupled to the comparator output;
   a counter coupled to the comparator output to generate a hybrid analog to digital converter output; and
   a single bit DAC coupled to the integrator input, wherein the single bit DAC is controlled by the comparator during a sigma delta converter operation.

2. The hybrid analog to digital converter of claim 1, wherein the single bit DAC comprises:
   a current source;
   and a switch coupled to the current source and the integrator input, wherein the switch selectively couples the current source to the integrator input during the sigma delta converter operation.

3. The hybrid analog to digital converter of claim 1, further comprising:
   a transconductor coupled to the hybrid analog to digital converter input to convert an input voltage to an input current.

4. The hybrid analog to digital converter of claim 1, wherein the switch is controlled by the comparator output.

5. The hybrid analog to digital converter of claim 1, wherein the DAC is a current DAC.

6. The hybrid analog to digital converter of claim 1, wherein the current DAC comprises a plurality of DAC current sources and a plurality of DAC switches, wherein each DAC current source and DAC switch represent a bit position.

7. The hybrid analog to digital converter of claim 6, wherein the successive approximation register controls the plurality of DAC switches during successive approximation register converter operations according to the comparator output.

8. The hybrid analog to digital converter of claim 1, further comprising:
   an XOR gate coupled to the comparator.

9. The hybrid analog to digital converter of claim 1, wherein the counter is a decimation filter.

10. The hybrid analog to digital converter of claim 1, wherein the hybrid analog to digital converter is higher than a first order converter.

11. The hybrid analog to digital converter of claim 10, further comprising:
    at least another integrator;
    a plurality of weighting devices; and
    a summing junction coupled to the plurality of weighting devices.

12. The hybrid analog to digital converter of claim 1, wherein the comparator is a single bit quantizer.

13. The hybrid analog to digital converter of claim 1, wherein the comparator is a multi-bit quantizer.

14. A method of converting an analog signal into a digital signal while removing a DC offset, comprising:
    in a coarse calibration phase, performing successive approximation register bit trials to calculate a coarse calibration value of the DC offset;
    in a fine calibration phase, performing incremental continuous time sigma delta conversion to calculate a fine calibration value of the DC offset using the coarse calibration value of the DC offset; and
    in a normal operation phase, converting an input analog signal into a digital signal and removing the DC offset using both the coarse calibration value and fine calibration value of the DC offset.

15. The method of claim 14, wherein a shared comparator and a shared integrator are used in the coarse calibration phase, the fine calibration phase, and the normal operation phase.

16. The method of claim 14, wherein a calibration voltage is used in the coarse calibration phase and fine calibration phase.

17. The method of claim 16, further comprising converting the calibration voltage into a calibration current.

18. The method of claim 14, further comprising adjusting a count in a first direction during fine calibration phase and adjusting the count in a second direction during normal operation phase.

19. An apparatus comprising:
a sensor to receive an information signal and convert the information signal to an AC signal; and
a hybrid converter to receive the AC signal, convert the AC signal into a digital signal, and remove a DC offset, comprising:
a DAC;
an integrator having an input coupled to the DAC;
a comparator coupled to the integrator;
a successive approximation register coupled to the comparator; and
a counter coupled to the comparator,
wherein the hybrid converter is operable as a successive approximation register converter and a continuous time sigma delta converter.

20. The apparatus of claim 19, wherein the sensor and the hybrid converter are on a single die.

* * * * *